United States Patent
Liu et al.

(10) Patent No.: US 12,331,389 B2
(45) Date of Patent: Jun. 17, 2025

(54) SELF-LUBRICATING FILM OVER WIDE TEMPERATURE RANGES IN VACUUM AND PREPARATION METHOD AND USE THEREOF

(71) Applicant: Lanzhou Institute of Chemical Physics, CAS, Lanzhou (CN)

(72) Inventors: Xiaohong Liu, Lanzhou (CN); Hongxuan Li, Lanzhou (CN); Ru Wang, Lanzhou (CN); Li Ji, Lanzhou (CN); Huidi Zhou, Lanzhou (CN); Jianmin Chen, Lanzhou (CN)

(73) Assignee: Lanzhou Institute of Chemical Physics, CAS, Lanzhou (CN)

( * ) Notice: Subject to any disclaimer, the term of this patent is extended or adjusted under 35 U.S.C. 154(b) by 174 days.

(21) Appl. No.: 18/054,214

(22) Filed: Nov. 10, 2022

(65) Prior Publication Data
US 2023/0160052 A1    May 25, 2023

(30) Foreign Application Priority Data

Nov. 23, 2021 (CN) .......................... 202111393729.6

(51) Int. Cl.
*C23C 14/02* (2006.01)
*C23C 14/06* (2006.01)
(Continued)

(52) U.S. Cl.
CPC .......... *C23C 14/025* (2013.01); *C23C 14/021* (2013.01); *C23C 14/0623* (2013.01);
(Continued)

(58) Field of Classification Search
CPC ................ C23C 14/025; C23C 14/021; C23C 14/0623; C23C 14/067; C23C 14/14; C23C 14/3464; C23C 14/35
See application file for complete search history.

(56) References Cited

U.S. PATENT DOCUMENTS

| | | | |
|---|---|---|---|
| 6,423,419 B1* | 7/2002 | Teer | C23C 14/02 51/297 |
| 2008/0031557 A1* | 2/2008 | Yamanaka | C23C 14/35 384/463 |
| 2018/0148825 A1* | 5/2018 | Zhang | C23C 14/025 |

FOREIGN PATENT DOCUMENTS

CN          112176297 A    *  1/2021

OTHER PUBLICATIONS

Baran, Özlem, et al. "Investigation of the friction and wear properties of Ti/TiB2/MoS2 graded-composite coatings deposited by CFUBMS under air and vacuum conditions." Surface and Coatings Technology 260 (2014): 310-315. (Year: 2014).*

* cited by examiner

*Primary Examiner* — Michael Zhang
(74) *Attorney, Agent, or Firm* — Thomas Horstemeyer, LLP (57) ABSTRACT

The present disclosure belongs to the technical field of functional films, and in particular relates to a self-lubricating film over wide temperature ranges in vacuum and a preparation method and use thereof. The present disclosure provides a self-lubricating film over wide temperature ranges in vacuum, including: a bonding layer, a transition layer and a lubricating layer laminated in sequence, wherein the bonding layer has a chemical composition of Ti; the transition layer has a chemical composition of Ti and $TiB_2$; the lubricating layer has a chemical composition of Ti, $TiB_2$ and $MoS_2$. In the present disclosure, when the self-lubricating films over wide temperature ranges in vacuum are exposed to different temperatures, different components of Ti, $TiB_2$ and $MoS_2$ in the films may be correspondingly excited to enrich in frictional contact areas. The composition of each layer synergistically exerts a lubricating effect and improves the tribological properties and stability of the self-lubricat- (Continued)

ing film over wide temperature ranges in vacuum in a vacuum over a wide temperature range.

11 Claims, 8 Drawing Sheets (51) Int. Cl.
*C23C 14/14* (2006.01)
*C23C 14/34* (2006.01)
*C23C 14/35* (2006.01)
(52) U.S. Cl.
CPC ............ *C23C 14/067* (2013.01); *C23C 14/14* (2013.01); *C23C 14/3464* (2013.01); *C23C 14/35* (2013.01)

SELF-LUBRICATING FILM OVER WIDE TEMPERATURE RANGES IN VACUUM AND PREPARATION METHOD AND USE THEREOF

CROSS-REFERENCE TO RELATED APPLICATION

This patent application claims the benefit and priority of Chinese Patent Application No. 202111393729.6, entitled "Self-lubricating film over wide temperature ranges in vacuum and preparation method and use thereof" filed on Nov. 23, 2021, the disclosure of which is incorporated by reference herein in its entirety as part of the present application.

TECHNICAL FIELD

The present disclosure belongs to the technical field of functional films, and in particular relates to a self-lubricating film over wide temperature ranges in vacuum and a preparation method and use thereof.

BACKGROUND ART

In the aerospace industry, there are a large number of mechanical moving parts that are required to work continuously in vacuum and high-temperature environments. The friction, wear and lubrication problems of the mechanical moving parts are the keys affecting the reliability and long life of the aircrafts. For example, the service temperature for the control bearing of the rudder surface of a near-space vehicle is 450° C. or higher, and the deep-space probes for such as Mercury and Venus face temperatures of 500° C. or higher. Lubricating materials are required to maintain a stable structure and performance at a high temperature in a range of 500-600° C. and to provide a continuous and reliable lubrication in a wide temperature range from room temperature to 600° C., in order to meet the requirements on temperature alternation of room temperature-high temperature (600° C.)-room temperature during the starting-working-shutdown process of motion mechanisms and the requirements on repeated use.

$MoS_2$ films have an excellent lubrication performance in vacuum. However, studies (K. C. Wong, X. Lu, J. Cotter et al., Surface and friction characterization of $MoS_2$ and $WS_2$ third body thin films under simulated wheel/rail rolling-sliding contact[J], Wear, 2008, 264(7-8), 526-534; L. Gu, L. Q. Wang et al., Research status of cryogenic solid lubrication [N], Tribology, 2002, 22(4), 314-320) have shown that $MoS_2$, although having a good lubricating performance within a range of −100 to 300° C., loses its lubricating performance very soon after the temperature exceeds 300° C. Thus, self-lubricating properties with high-temperature resistance and wide temperature ranges have become a main problem limiting further application of $MoS_2$. The $MoS_2$ composites may improve the temperature range for lubrication of $MoS_2$-based films. For example, Chinese patent application CN 108977776 A discloses a high-bonding-force solid lubricating film layer used in wide temperature range environment and a preparation method of solid lubricating film layer, where a $TiN/MoS_2$—Ag multilayer composite film is prepared by the magnetron sputtering technology. However, with a service temperature of −150 to 300° C., the film layer exhibits poor stabilities of structure and performance at 500 to 600° C., and cannot meet the requirements for the continuous and reliable lubrication performances within a wide temperature range from room temperature to 600° C. under vacuum.

SUMMARY

In view of this, an objective of the present disclosure is to provide a self-lubricating film over wide temperature ranges in vacuum. The self-lubricating film over wide temperature ranges in vacuum provided by the present disclosure is characterized by a low friction coefficient and a long sliding life in a vacuum over a wide temperature range from room temperature to 600° C.

In order to achieve the objective of the present disclosure, the present disclosure provides the following technical solutions:

The present disclosure provides a self-lubricating film over wide temperature ranges in vacuum, comprising: a bonding layer, a transition layer and a lubricating layer laminated in sequence, wherein the bonding layer has a chemical composition of Ti; the transition layer has a chemical composition of Ti and $TiB_2$; the lubricating layer has a chemical composition of Ti, $TiB_2$ and $MoS_2$.

In some embodiments, in the transition layer, a molar ratio of Ti to $TiB_2$ is within a range of 1:(1-2).

In some embodiments, in the lubricating layer, Ti is comprised in an amount of 10-30 at. %, B is comprised in an amount of 5-20 at. %, and the balance is $MoS_2$.

In some embodiments, a thickness ratio of the bonding layer, the transition layer and the lubricating layer is within a range of 1:(1-3):(5-10).

The present disclosure further provides a method for preparing the self-lubricating film over wide temperature ranges in vacuum according to the above technical solution, comprising:

using a Ti target to conduct a first unbalanced magnetron sputtering on a surface of a substrate to form a bonding layer on the surface of the substrate;

using a Ti target and a $TiB_2$ target to conduct a second unbalanced magnetron sputtering on a surface of the bonding layer to form a transition layer on the surface of the bonding layer; and using a Ti target, a $TiB_2$ target and a $MoS_2$ target to conduct a third unbalanced magnetron sputtering on a surface of the transition layer to form the self-lubricating film over wide temperature ranges in vacuum on the surface of the substrate.

In some embodiments, the first unbalanced magnetron sputtering is conducted under the following conditions: a working gas is argon, the working gas has a pressure within a range of 0.1-0.4 Pa, the Ti target has a sputtering current within a range of 2-6 A, and a negative bias voltage is within a range of 100-400 V.

In some embodiments, the second unbalanced magnetron sputtering is conducted under the following conditions: a working gas is argon, the working gas has a pressure within a range of 0.1-0.4 Pa, the Ti target has a sputtering current within a range of 0.4-1 A, the $TiB_2$ target has a sputtering current within a range of 2-6 A, and a negative bias voltage is within a range of 100-400 V.

In some embodiments, the third unbalanced magnetron sputtering is conducted under the following conditions: a working gas is argon, the working gas has a pressure within a range of 0.1-0.4 Pa, the Ti target has a sputtering current within a range of 0.4-1 A, the $TiB_2$ target has a sputtering current within a range of 0.4-1 A, the $MoS_2$ target has a sputtering current within a range of 1-3 A, and a negative bias voltage is within a range of 40-100 V.

The present disclosure further provides use of the self-lubricating film over wide temperature ranges in vacuum according to the above technical solution or the self-lubricating film over wide temperature ranges in vacuum prepared by the method according to the above technical solution in an aerospace equipment component.

In some embodiments, a method for preparing the self-lubricating film over wide temperature ranges in vacuum on a surface of the aerospace equipment component comprises: preparing the self-lubricating film over wide temperature ranges in vacuum by taking the aerospace equipment component as a substrate; and after forming the self-lubricating film over wide temperature ranges in vacuum on a surface of the substrate, the substrate is not removed.

The present disclosure provides a self-lubricating film over wide temperature ranges in vacuum, comprising: a bonding layer, a transition layer and a lubricating layer laminated in sequence; wherein the bonding layer has a chemical composition of Ti; the transition layer has a chemical composition of Ti and $TiB_2$; the lubricating layer has a chemical composition of Ti, $TiB_2$ and $MoS_2$. In the present disclosure, when the self-lubricating films over wide temperature ranges in vacuum are exposed to different temperatures, different components of Ti, $TiB_2$ and $MoS_2$ in the films may be correspondingly excited to enrich in frictional contact areas. $MoS_2$ exerts a lubricating effect at low temperatures (less than 300° C.). $TiB_2$ exerts a lubricating effect at high temperatures (more than 300° C.). The composition of each layer synergistically exerts a lubricating effect improves the tribological properties of the self-lubricating film in a vacuum over a wide temperature range, reduces the friction coefficient and increases the sliding life. Moreover, the elemental composition of the adjacent interlayer is close, which improves the structural stability of the film, thereby improving the tribological stability of the film.

Further, the chemical composition of the bonding layer, transition layer and lubricating layer of the self-lubricating film with wide temperature ranges under vacuum prepared according to the present disclosure is a gradient design of elemental composition transition, so that the closer chemical composition is, the higher the bonding strength, thereby improving the bonding strength of the self-lubricating film over wide temperature ranges in vacuum. At the same time, because two adjacent layers have closer structures, the film failure caused by thermal stress mismatch at high temperature may further be prevented. The thermal shock resistance of the self-lubricating film over wide temperature ranges in vacuum may be improved.

The test results of the examples show that the self-lubricating film over wide temperature ranges in vacuum prepared according to the present disclosure has a friction coefficient of less than 0.08 and a sliding friction life of more than $1 \times 10^5$ r.

DETAILED DESCRIPTION OF THE EMBODIMENTS

The present disclosure provides a self-lubricating film over wide temperature ranges in vacuum, comprising: a bonding layer, a transition layer and a lubricating layer laminated in sequence, wherein the bonding layer has a chemical composition of Ti; the transition layer has a chemical composition of Ti and $TiB_2$; the lubricating layer has a chemical composition of Ti, $TiB_2$ and $MoS_2$.

In the present disclosure, the self-lubricating film over wide temperature ranges in vacuum comprises a bonding layer. In the present disclosure, the bonding layer has a chemical composition of Ti.

In the present disclosure, the self-lubricating film over wide temperature ranges in vacuum comprises a transition layer. In the present disclosure, the transition layer has a chemical composition of Ti and $TiB_2$. In the present disclosure, in the transition layer, a molar ratio of Ti to $TiB_2$ preferably is in a range of 1:(1-2), more preferably 1:(1.2-1.8), and most preferably 1:(1.3-1.7).

In the present disclosure, the self-lubricating film over wide temperature ranges in vacuum comprises a lubricating layer. In the present disclosure, the lubricating layer has a chemical composition of Ti, $TiB_2$ and $MoS_2$. In the present disclosure, in the lubricating layer, Ti preferably is comprised in an amount of 10-30 at. %, more preferably 12-28 at. %, and most preferably 15-25 at. %; B preferably is comprised in an amount of 5-20 at. %, more preferably 8-18 at. %, and most preferably 10-15 at. %; and the balance is $MoS_2$.

In the present disclosure, a thickness ratio of the bonding layer to the transition layer preferably is within a range of 1:(1-3), more preferably 1:(1.2-2.8), and most preferably 1:(1.5-2.5). In the present disclosure, a thickness ratio of the bonding layer to the lubricating layer preferably is within a range of 1:(5-10), more preferably 1:(5.5-9.5), and most preferably 1:(6-9).

In the present disclosure, the self-lubricating film over wide temperature ranges in vacuum preferably has a thickness of 0.5-8 μm, more preferably 2-6 μm, and most preferably 3-5 μm.

In the present disclosure, the self-lubricating film over wide temperature ranges in vacuum preferably has a friction coefficient of less than or equal to 0.08, and more preferably 0.01-0.08 in a vacuum and wide-temperature-range environment. In some embodiments, the sliding life is more than or equal to $1.0 \times 10^5$ r; the vacuum has a vacuum degree of less than or equal to $1 \times 10^{-3}$ Pa; the wide temperature range is from 18 to 600° C.

The present disclosure further provides a method for preparing the self-lubricating film over wide temperature ranges in vacuum according to the above technical solution, comprising:

using a Ti target to conduct a first unbalanced magnetron sputtering on a surface of a substrate to form a bonding layer on the surface of the substrate;

using a Ti target and a $TiB_2$ target to conduct a second unbalanced magnetron sputtering on a surface of the bonding layer to form a transition layer on the surface of the bonding layer; and using a Ti target, a $TiB_2$ target and a $MoS_2$ target to conduct a third unbalanced magnetron sputtering on a surface of the transition layer to form the self-lubricating film over wide temperature ranges in vacuum on the surface of the substrate.

In the present disclosure, unless otherwise specified, the substances used in the preparation method are all commercially available products well known to those skilled in the art.

In the present disclosure, a Ti target is used to conduct a first unbalanced magnetron sputtering on a surface of a substrate to form a bonding layer on the surface of the substrate.

In the present disclosure, in some embodiments, the substrate is a high-temperature alloy. There is no specific limitation on the high-temperature alloy, as long as the high-temperature alloy well-known to those skilled in the art may be used.

Before the first unbalanced magnetron sputtering is conducted, in the present disclosure, in some embodiments, the substrate is subjected to pretreatment to obtain an activated substrate. In the present disclosure, in some embodiments, the pretreatment preferably is conducted by the following steps: washing and plasma treatment in sequence. In the present disclosure, in some embodiments, the washing is acetone washing. In the present disclosure, in some embodiments, the washing is conducted under ultrasonic conditions.

In the present disclosure, in some embodiments, the plasma treatment is implemented by vacuuming a plasma processing chamber and then introducing a plasma gas. In the present disclosure, in some embodiments, the vacuum degree of the vacuuming plasma processing chamber is $4.0 \times 10^{-3}$ Pa. In the present disclosure, in some embodiments, the plasma treatment comprises the following conditions: a plasma gas is preferably argon, the plasma gas has a pressure within a range of 1-2 Pa; a pulsed bias voltage preferably is within a range of 400-800 V, more preferably 450-750 V, and most preferably 500-700 V, and the plasma treatment preferably is conducted for 20-60 min, more preferably 25-55 min, and most preferably 30-50 min.

In the present disclosure, in some embodiments, the substrate surface is cleaned and activated through pretreatment.

In the present disclosure, the first unbalanced magnetron sputtering is conducted under the following conditions: a working gas is preferably argon, the working gas preferably has a pressure within a range of 0.1-0.4 Pa, more preferably 0.15-0.35 Pa, and most preferably 0.2-0.3 Pa, the Ti target preferably has a sputtering current within a range of 2-6 A, more preferably 2.5-5.5 A, and most preferably 3-5 A, and a negative bias voltage preferably is within a range of 100-400 V, more preferably 150-350 V, and most preferably 200-300 V.

In the present disclosure, after the bonding layer is obtained, a Ti target and a $TiB_2$ target are used to conduct a second unbalanced magnetron sputtering on a surface of the bonding layer to form a transition layer on the surface of the bonding layer.

In the present disclosure, the second unbalanced magnetron sputtering is conducted under the following conditions: a working gas is preferably argon, the working gas preferably has a pressure within a range of 0.1-0.4 Pa, more preferably 0.15-0.35 Pa, and most preferably 0.2-0.3 Pa, the Ti target preferably has a sputtering current within a range of 0.4-1 A, more preferably 0.5-0.9 A, and most preferably 0.6-0.8 A, the $TiB_2$ target preferably has a sputtering current within a range of 2-6 A, more preferably 2.5-5.5 A, and most preferably 3-5 A, and a negative bias voltage preferably is within a range of 100-400 V, more preferably 150-350 V, and most preferably 200-300 V.

In the present disclosure, after the transition layer is obtained, a Ti target, a $TiB_2$ target and a $MoS_2$ target are used to conduct a third unbalanced magnetron sputtering on a surface of the transition layer to form the self-lubricating film over wide temperature ranges in vacuum on the surface of the substrate.

In the present disclosure, the third unbalanced magnetron sputtering is conducted under the following conditions: a working gas preferably is argon, the working gas preferably has a pressure within a range of 0.1-0.4 Pa, more preferably 0.15-0.35 Pa, and most preferably 0.2-0.3 Pa, the Ti target preferably has a sputtering current within a range of 0.4-1 A, more preferably 0.5-0.9 A, and most preferably 0.6-0.8 A, the $TiB_2$ target preferably has a sputtering current within a range of 0.4-1 A, more preferably 0.5-0.9 A, and most preferably 0.6-0.8 A, the $MoS_2$ target preferably has a sputtering current within a range of 1-3 A, more preferably 1.3-2.8 A, and most preferably 1.5-2.5 A, and a negative bias voltage preferably is within a range of 40-100 V, more preferably 45-95 V, and most preferably 50-90 V.

The present disclosure further provides use of the self-lubricating film over wide temperature ranges in vacuum according to the above technical solution or the self-lubricating film over wide temperature ranges in vacuum prepared by the method according to the above technical solution in an aerospace equipment component.

There is no specific limitation on the aerospace equipment component. The component that requires the surface to have self-lubricating properties shall prevail, specifically, for example, mechanical moving components, and more specifically, for example, bearings or gears.

In the present disclosure, in some embodiments, a method for preparing the self-lubricating film over wide temperature ranges in vacuum on the surface of the aerospace equipment component comprises: preparing the self-lubricating film over wide temperature ranges in vacuum by taking the aerospace equipment component as a substrate; and after forming the self-lubricating film over wide temperature ranges in vacuum on a surface of the substrate, the substrate is not removed. Other preparation methods are consistent with the method for preparing the self-lubricating film with wide temperature ranges under vacuum. The self-lubricating film over wide temperature ranges in vacuum formed on the surface of the aerospace equipment component confers an excellent self-lubricating property on the surface of the aerospace equipment component in a vacuum over a wide temperature range.

In order to further illustrate the present disclosure, a self-lubricating film over wide temperature ranges in vacuum, a preparation method and use thereof provided by the present disclosure will be described in detail below with reference to the examples, but they should not be construed as limiting the protection scope of the present disclosure. Apparently, the described examples are only a part of, but not all, the examples of the present disclosure. All other examples obtained by a person of ordinary skill in the art based on the examples of the present disclosure without creative efforts shall fall within the protection scope of the present disclosure.

Example 1

A substrate was washed with acetone under ultrasonic conditions, and then placed in an unbalanced magnetron sputtering vacuum chamber. The chamber was vacuumed to $3.0\times10^{-3}$ Pa. Argon was introduced until the pressure in the chamber was 1.0 Pa. A surface of the substrate was subjected to a plasma treatment at a pulsed bias voltage of 400 V for 60 min, obtaining an activated substrate.

A Ti target was used to conduct a first unbalanced magnetron sputtering on a surface of the activated substrate. The first unbalanced magnetron sputtering was conducted under the following conditions: a working gas was argon, argon had a pressure of 0.1 Pa, the Ti target had a sputtering current of 2 A and a negative bias voltage was 100 V. A bonding layer with a thickness of 200 nm was formed on the surface of the activated substrate.

A Ti target and a $TiB_2$ target were used to conduct a second unbalanced magnetron sputtering on a surface of the bonding layer. The second unbalanced magnetron sputtering was conducted under the following conditions: a working gas was argon, argon had a pressure of 0.1 Pa, the Ti target had a sputtering current of 0.4 A, the $TiB_2$ target had a sputtering current of 2 A and a negative bias voltage was 100 V. A transition layer with a thickness of 400 nm was formed on the surface of the bonding layer.

A Ti target, a $TiB_2$ target and a $MoS_2$ target were used to conduct a third unbalanced magnetron sputtering on a surface of the transition layer. The third unbalanced magnetron sputtering was conducted under the following conditions: a working gas was argon, argon had a pressure of 0.1 Pa, the Ti target had a sputtering current of 0.4 A, the $TiB_2$ target had a sputtering current of 0.4 A, the $MoS_2$ target had a sputtering current of 1.2 A and a negative bias voltage was 40 V. A lubricating layer with a thickness of 1,000 nm (where Ti was comprised in an amount of 15.9 at %, B was comprised in an amount of 10.2 at. %, and the balance was $MoS_2$) was formed on the surface of the transition layer. A self-lubricating film over wide temperature ranges in vacuum was formed on the surface of the activated substrate, and the activated substrate was removed, obtaining a self-lubricating film over wide temperature ranges in vacuum with a thickness of 1,600 nm.

Example 2

A substrate was washed with acetone under ultrasonic conditions, and then placed in an unbalanced magnetron sputtering vacuum chamber. The chamber was vacuumed to $3.0\times10^{-3}$ Pa. Argon was introduced until the pressure in the chamber was 2.0 Pa. A surface of the substrate was subjected to a plasma treatment at a pulsed bias voltage of 800 V for 20 min, obtaining an activated substrate.

A Ti target was used to conduct a first unbalanced magnetron sputtering on a surface of the activated substrate. The first unbalanced magnetron sputtering was conducted under the following conditions: a working gas was argon, argon had a pressure of 0.4 Pa, the Ti target had a sputtering current of 6 A and a negative bias voltage was 400 V. A bonding layer with a thickness of 500 nm was formed on the surface of the activated substrate.

A Ti target and a $TiB_2$ target were used to conduct a second unbalanced magnetron sputtering on a surface of the bonding layer. The second unbalanced magnetron sputtering was conducted under the following conditions: a working gas was argon, argon had a pressure of 0.4 Pa, the Ti target had a sputtering current of 1 A, the $TiB_2$ target had a sputtering current of 6 A and a negative bias voltage was 400 V. A transition layer with a thickness of 1,000 nm was formed on the surface of the bonding layer.

A Ti target, a $TiB_2$ target and a $MoS_2$ target were used to conduct a third unbalanced magnetron sputtering on a surface of the transition layer. The third unbalanced magnetron sputtering was conducted under the following conditions: a working gas was argon, argon had a pressure of 0.4 Pa, the Ti target had a sputtering current of 1 A, the $TiB_2$ target had a sputtering current of 1 A, the $MoS_2$ target had a sputtering current of 3 A and a negative bias voltage was 100 V. A lubricating layer with a thickness of 4,000 nm (where Ti was comprised in an amount of 17.3 at %, B was comprised in an amount of 11.6 at. %, and the balance was $MoS_2$) was formed on the surface of the transition layer. A self-lubricating film over wide temperature ranges in vacuum was formed on the surface of the activated substrate, and the activated substrate was removed, obtaining a self-lubricating film over wide temperature ranges in vacuum with a thickness of 5,500 nm.

Example 3

A substrate was washed with acetone under ultrasonic conditions, and then placed in an unbalanced magnetron sputtering vacuum chamber. The chamber was vacuumed to $2.0\times10^{-3}$ Pa. Argon was introduced until the pressure in the chamber was 1.5 Pa. A surface of the substrate was subjected to a plasma treatment at a pulsed bias voltage of 600 V for 40 min, obtaining an activated substrate.

A Ti target was used to conduct a first unbalanced magnetron sputtering on a surface of the activated substrate. The first unbalanced magnetron sputtering was conducted under the following conditions: a working gas was argon, argon had a pressure of 0.2 Pa, the Ti target had a sputtering current of 4 A and a negative bias voltage was 200 V. A bonding layer with a thickness of 300 nm was formed on the surface of the activated substrate.

A Ti target and a $TiB_2$ target were used to conduct a second unbalanced magnetron sputtering on a surface of the bonding layer. The second unbalanced magnetron sputtering was conducted under the following conditions: a working gas was argon, argon had a pressure of 0.2 Pa, the Ti target had a sputtering current of 0.6 A, the $TiB_2$ target had a sputtering current of 4 A and a negative bias voltage was 200 V. A transition layer with a thickness of 500 nm was formed on the surface of the bonding layer.

A Ti target, a TiB$_2$ target and a MoS$_2$ target were used to conduct a third unbalanced magnetron sputtering on a surface of the transition layer. The third unbalanced magnetron sputtering was conducted under the following conditions: a working gas was argon, argon had a pressure of 0.2 Pa, the Ti target had a sputtering current of 0.6 A, the TiB$_2$ target had a sputtering current of 0.6 A, the MoS$_2$ target had a sputtering current of 2 A and a negative bias voltage was 60 V. A lubricating layer with a thickness of 2,000 nm (where Ti was comprised in an amount of 16.7 at %, B was comprised in an amount of 9.2 at. %, and the balance was MoS$_2$) was formed on the surface of the transition layer. A self-lubricating film over wide temperature ranges in vacuum was formed on the surface of the activated substrate, and the activated substrate was removed, obtaining a self-lubricating film over wide temperature ranges in vacuum with a thickness of 2,800 nm.

Comparative Example 1

A substrate was washed with acetone under ultrasonic conditions, and then placed in an unbalanced magnetron sputtering vacuum chamber. The chamber was vacuumed to $3.0 \times 10^{-3}$ Pa. Argon was introduced until the pressure in the chamber was 1.0 Pa. A surface of the substrate was subjected to a plasma treatment at a pulsed bias voltage of 400 V for 60 min, obtaining an activated substrate.

A Ti target was used to conduct a first unbalanced magnetron sputtering on a surface of the activated substrate. The first unbalanced magnetron sputtering was conducted under the following conditions: a working gas was argon, argon had a pressure of 0.1 Pa, the Ti target had a sputtering current of 2 A and a negative bias voltage was 100 V. A bonding layer with a thickness of 200 nm was formed on the surface of the activated substrate.

A Ti target and the MoS$_2$ target were used to conduct a second unbalanced magnetron sputtering on a surface of the bonding layer. The second unbalanced magnetron sputtering was conducted under the following conditions: a working gas was argon, argon had a pressure of 0.1 Pa, the Ti target had a sputtering current of 0.4 A, the MoS$_2$ target had a sputtering current of 1.2 A and a negative bias voltage was 40 V. A lubricating layer with a thickness of 1,200 nm (where Ti was comprised in an amount of 6.2 at %, and the balance was MoS$_2$) was formed on the surface of the bonding layer. A self-lubricating film over wide temperature ranges in vacuum was formed on the surface of the activated substrate, and the activated substrate was removed, obtaining a film with a thickness of 1,600 nm.

Comparative Example 2

A substrate was washed with acetone under ultrasonic conditions, and then placed in an unbalanced magnetron sputtering vacuum chamber. The chamber was vacuumed to $3.0 \times 10^{-3}$ Pa. Argon was introduced until the pressure in the chamber was 1.0 Pa. A surface of the substrate was subjected to a plasma treatment at a pulsed bias voltage of 400 V for 60 min, obtaining an activated substrate.

A Ti target was used to conduct a first unbalanced magnetron sputtering on a surface of the activated substrate. The first unbalanced magnetron sputtering was conducted under the following conditions: a working gas was argon, argon had a pressure of 0.1 Pa, the Ti target had a sputtering current of 2 A and a negative bias voltage was 100 V. A bonding layer with a thickness of 200 nm was formed on the surface of the activated substrate.

A MoS$_2$ target was used to conduct a second unbalanced magnetron sputtering on a surface of the bonding layer. The second unbalanced magnetron sputtering was conducted under the following conditions: a working gas was argon, argon had a pressure of 0.1 Pa, the MoS$_2$ target had a sputtering current of 1.2 A and a negative bias voltage was 40 V. A lubricating layer with a thickness of 1,200 nm (the lubricating layer was MoS$_2$) was formed on the surface of the bonding layer. A self-lubricating film over wide temperature ranges in vacuum was formed on the surface of the activated substrate, and the activated substrate was removed, obtaining a film with a thickness of 1,600 nm.

The tribological properties of the self-lubricating films over wide temperature ranges in vacuum prepared in Examples 1 to 3 were tested in a vacuum at different temperatures. The test method was performed as follows: a vacuum high-temperature ball-disk friction tester was used; the vacuum degree was less than $1 \times 10^{-3}$ Pa; the tests were performed at temperatures of 25° C., 100° C., 200° C., 300° C., 400° C., 500° C. and 600° C., respectively; the frictional pair was 16 mm GCr15 steel balls; the contact pressure was 5 N; the rotational friction speed was within a range of 565-1,040 mm/s; the friction time was 120 min.

Figure 1:
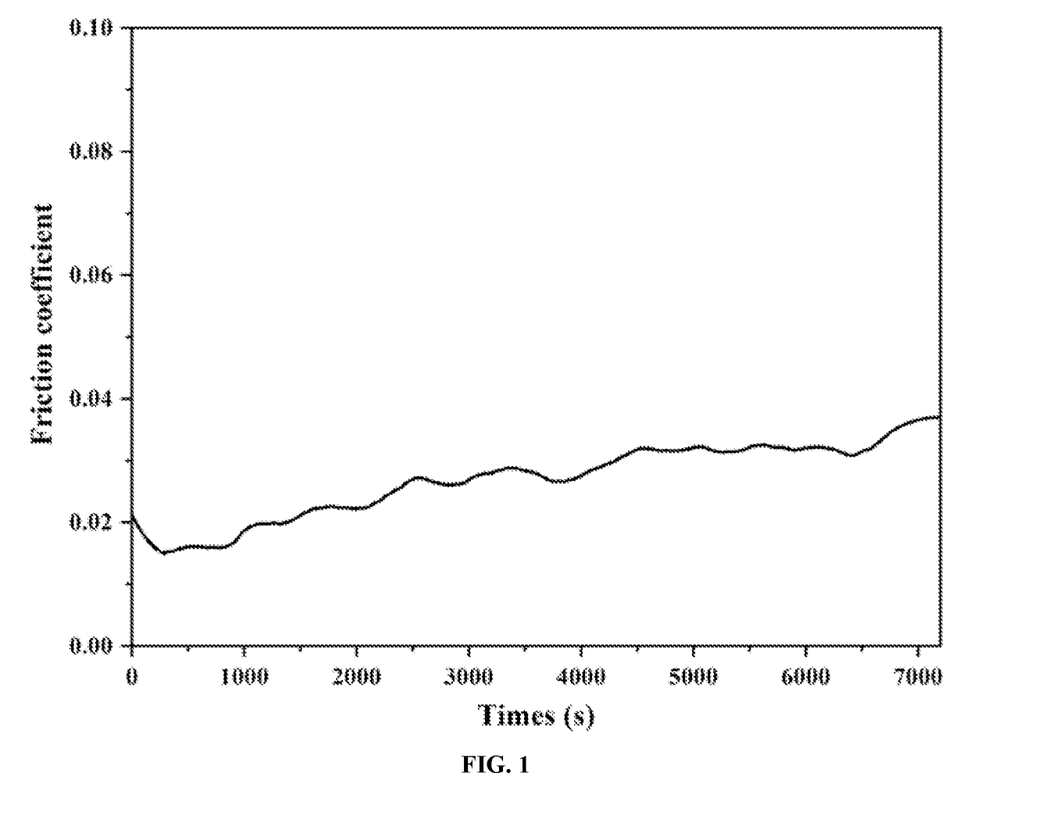
FIG. 1 shows a variation curve diagram of the friction coefficient of the self-lubricating film over wide temperature ranges in vacuum prepared in Example 1 at room temperature as a function of time.
Figure 2:
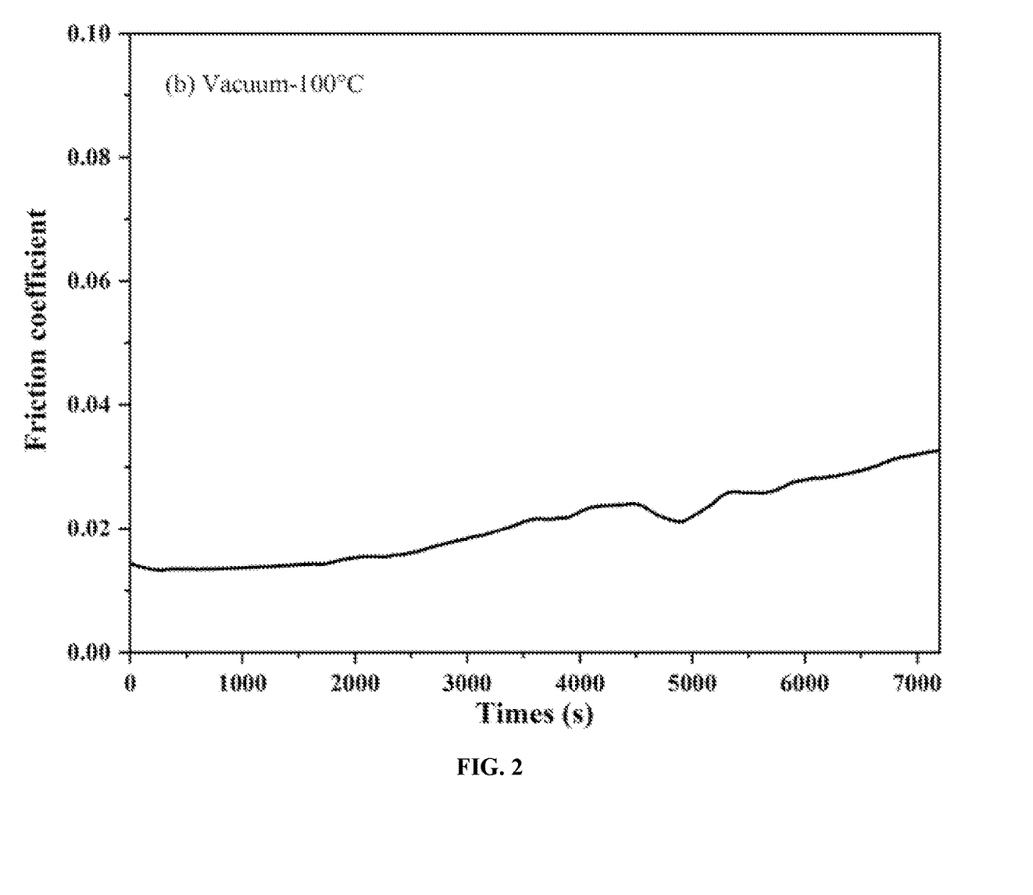
FIG. 2 shows a variation curve diagram of the friction coefficient of the self-lubricating film over wide temperature ranges in vacuum prepared in Example 1 in a vacuum and at 100° C. as a function of time.
Figure 3:
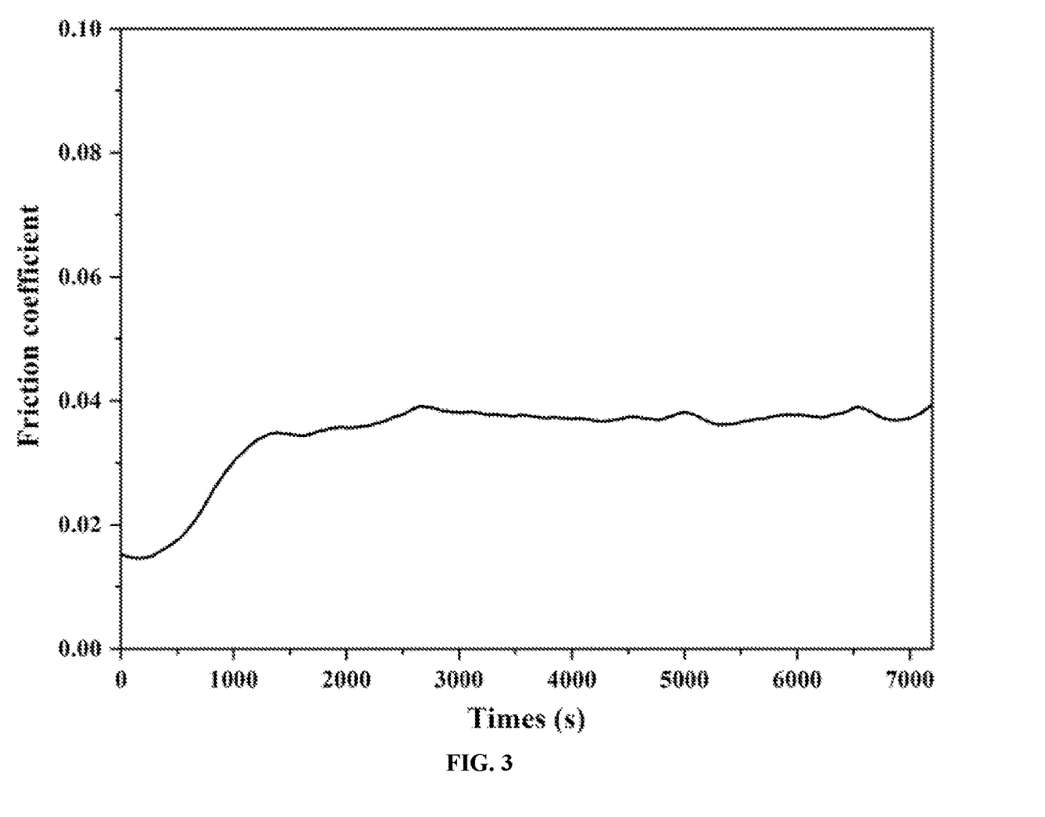
FIG. 3 shows a variation curve diagram of the friction coefficient of the self-lubricating film over wide temperature ranges in vacuum prepared in Example 1 in a vacuum and at 200° C. as a function of time.
Figure 4:
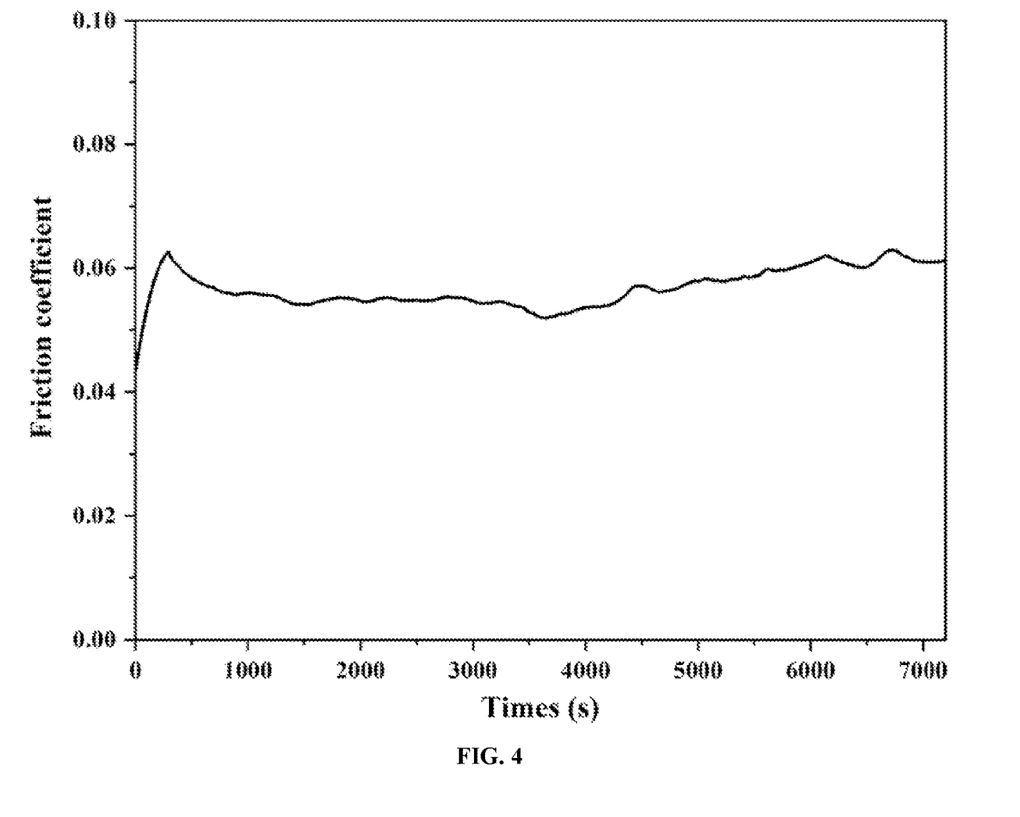
FIG. 4 shows a variation curve diagram of the friction coefficient of the self-lubricating film over wide temperature ranges in vacuum prepared in Example 1 in a vacuum and at 300° C. as a function of time.
Figure 5:
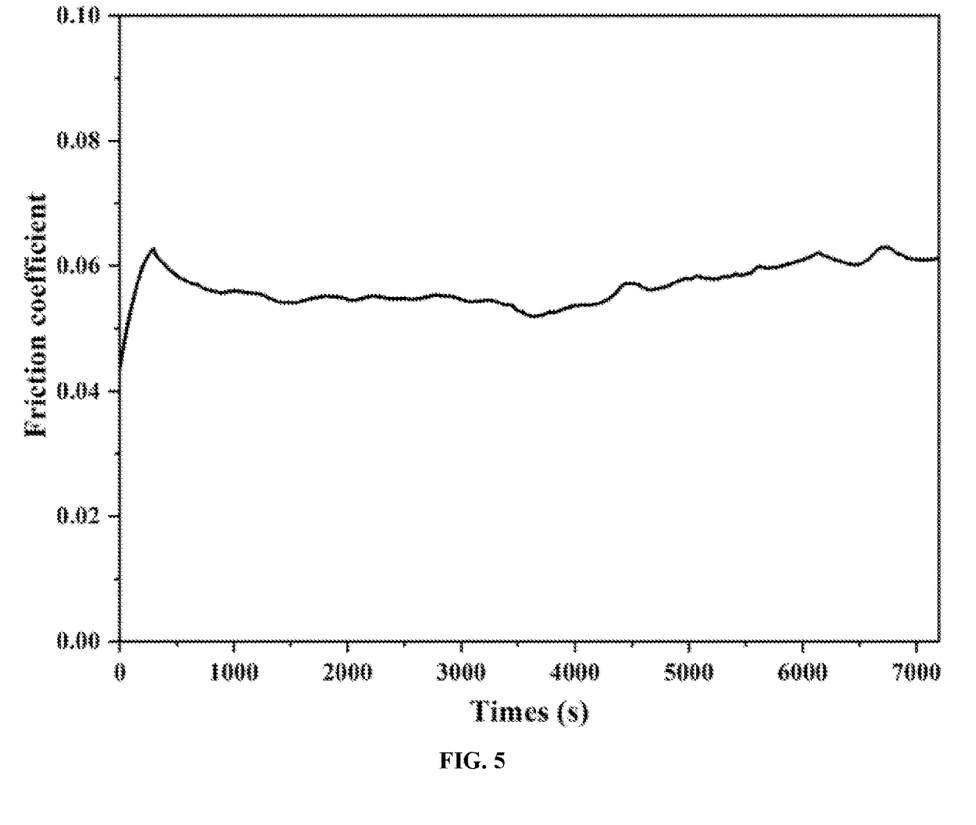
FIG. 5 shows a variation curve diagram of the friction coefficient of the self-lubricating film over wide temperature ranges in vacuum prepared in Example 1 in a vacuum and at 400° C. as a function of time.
Figure 6:
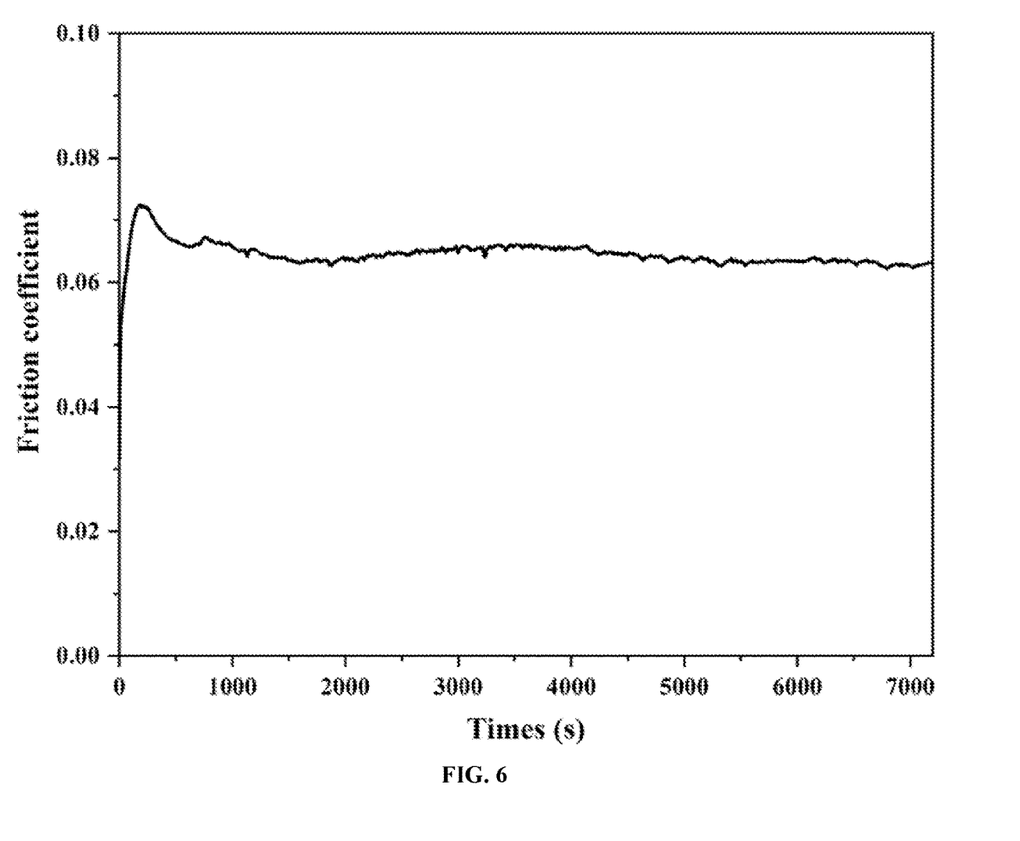
FIG. 6 shows a variation curve diagram of the friction coefficient of the self-lubricating film over wide temperature ranges in vacuum prepared in Example 1 in a vacuum and at 500° C. as a function of time.
Figure 7:
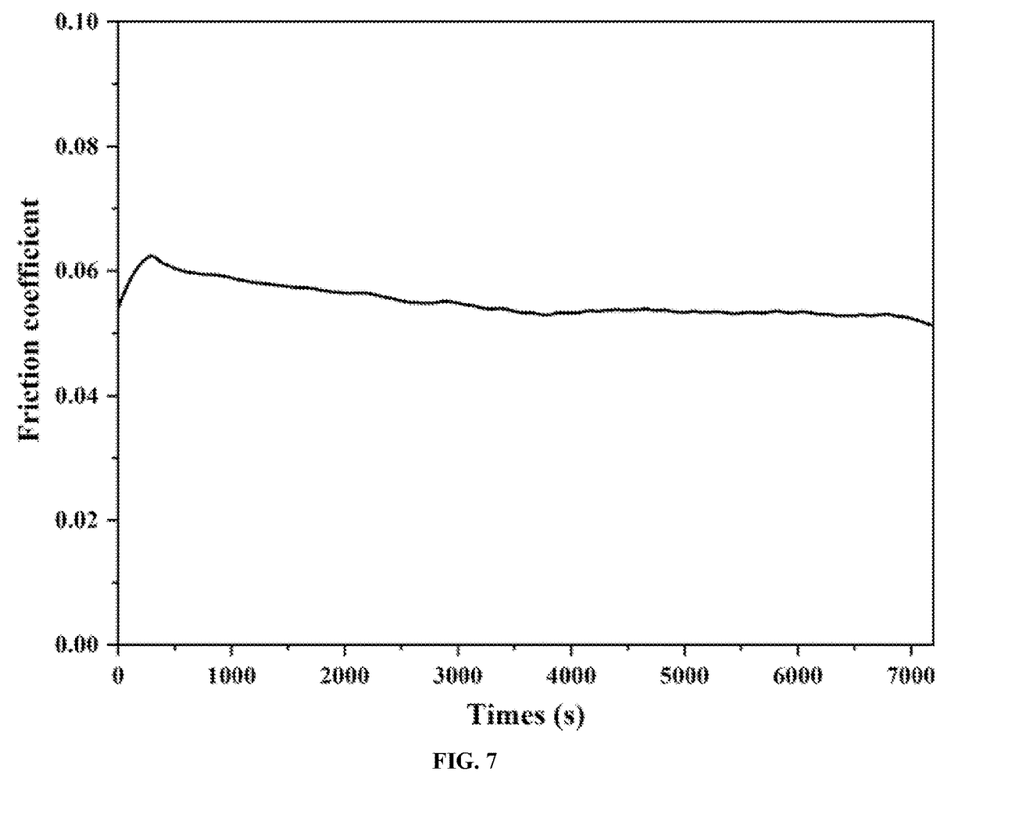
FIG. 7 shows a variation curve diagram of the friction coefficient of the self-lubricating film over wide temperature ranges in vacuum prepared in Example 1 in a vacuum and at 600° C. as a function of time.
Figure 8:
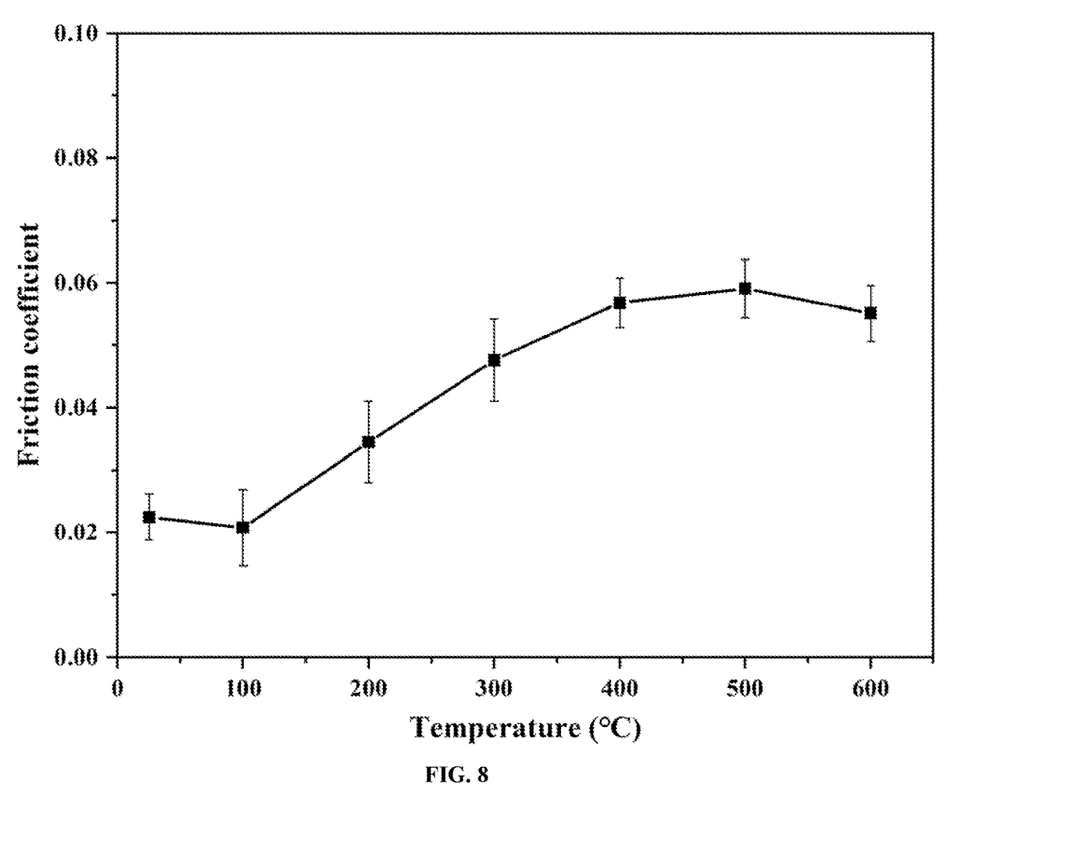
FIG. 8 shows a variation diagram of the average friction coefficient of the self-lubricating film over wide temperature ranges in vacuum prepared in Example 1 in a vacuum and at different temperatures.

FIGS. 1 to 7 show the variation curve diagram of the friction coefficient of the self-lubricating film over wide temperature ranges in vacuum prepared in Example 1 at different temperatures. Herein, FIG. 1 shows a variation curve diagram of the friction coefficient of the self-lubricating film over wide temperature ranges in vacuum prepared in Example 1 at room temperature (25° C.) as a function of time. FIG. 2 shows a variation curve diagram of the friction coefficient of the self-lubricating film over wide temperature ranges in vacuum prepared in Example 1 in a vacuum and at 100° C. as a function of time. FIG. 3 shows a variation curve diagram of the friction coefficient of the self-lubricating film over wide temperature ranges in vacuum prepared in Example 1 in a vacuum and at 200° C. as a function of time. FIG. 4 shows a variation curve diagram of the friction coefficient of the self-lubricating film over wide temperature ranges in vacuum prepared in Example 1 in a vacuum and at 300° C. as a function of time. FIG. 5 shows a variation curve diagram of the friction coefficient of the self-lubricating film over wide temperature ranges in vacuum prepared in Example 1 in a vacuum and at 400° C. as a function of time. FIG. 6 shows a variation curve diagram of the friction coefficient of the self-lubricating film over wide temperature ranges in vacuum prepared in Example 1 in a vacuum and at 500° C. as a function of time. FIG. 7 shows a variation curve diagram of the friction coefficient of the self-lubricating film over wide temperature ranges in vacuum prepared in Example 1 in a vacuum and at 600° C. as a function of time. FIG. 8 shows a variation diagram of the average friction coefficient of the self-lubricating film over wide temperature ranges in vacuum prepared in Example 1 in a vacuum and at different temperatures. It can be seen from FIGS. 1 to 8 that the self-lubricating film over wide temperature ranges in vacuum prepared according to the present disclosure has a friction coefficient of less than 0.08 in a vacuum over a temperature range from room temperature to 600° C. The friction coefficients are small and stable.

The results of the average friction coefficient and friction life of the self-lubricating films over wide temperature ranges in vacuum prepared in Examples 1 to 3 and the films prepared in Comparative Examples 1 to 2 in a vacuum at different temperatures are shown in Table 1.

TABLE 1

The results of the friction coefficient and friction life of the films prepared in Examples 1 to 3 and Comparative Examples 1 to 2

|  |  | Example 1 | Example 2 | Example 3 | Comparative Example 1 | Comparative Example 2 |
|---|---|---|---|---|---|---|
| Friction coefficient | 25° C. | 0.022 | 0.027 | 0.028 | 0.031 | 0.018 |
|  | 100° C. | 0.020 | 0.026 | 0.029 | 0.021 | 0.022 |
|  | 200° C. | 0.033 | 0.038 | 0.040 | 0.027 | 0.029* |
|  | 300° C. | 0.048 | 0.052 | 0.055 | 0.034* | / |
|  | 400° C. | 0.053 | 0.063 | 0.067 | / | / |
|  | 500° C. | 0.056 | 0.070 | 0.073 | / | / |
|  | 600° C. | 0.052 | 0.065 | 0.072 | / | / |
| Sliding friction life (r) | | >1.0 × 10$^5$ | >2.0 × 10$^5$ | >1.5 × 10$^5$ | / | / |

NOTE:
*in Table 1 indicates that the sliding friction life is less than 2,000 r at this time, and the continuous and reliable sliding fails at a higher temperature.

It can be seen from Table 1 that the self-lubricating film over wide temperature ranges in vacuum provided by the present disclosure has a friction coefficient of less than 0.08 in a vacuum (less than 1×10$^{-3}$ Pa), at 25-600° C., and a sliding life of more than 1×10$^5$ r.

The above are only the preferred embodiments of the present disclosure. It should be understood that for those of ordinary skill in the art, several improvements and modifications could be made without departing from the principle of the present disclosure, and those improvements and modifications also should be regarded as falling within the protection scope of the present disclosure.

What is claimed is:

1. A self-lubricating film over wide temperature ranges in vacuum, comprising: a bonding layer, a transition layer and a lubricating layer laminated in sequence,
   wherein the bonding layer has a chemical composition of Ti; the transition layer has a chemical composition of Ti and TiB$_2$; the lubricating layer has a chemical composition of Ti, TiB$_2$ and MoS$_2$; and
   wherein in the transition layer, a molar ratio of Ti to TiB$_2$ is within a range of 1:(1-2).

2. The self-lubricating film over wide temperature ranges in vacuum according to claim 1, wherein in the lubricating layer, Ti is comprised in an amount of 10-30 at. %, B is comprised in an amount of 5-20 at. %, and the balance is MoS$_2$.

3. The self-lubricating film over wide temperature ranges in vacuum according to claim 1, wherein a thickness ratio of the bonding layer, the transition layer and the lubricating layer is within a range of 1:(1-3):(5-10).

4. A self-lubricating film over wide temperature ranges in vacuum, comprising: a bonding layer, a transition layer and a lubricating layer laminated in sequence,
   wherein the bonding layer has a chemical composition of Ti; the transition layer has a chemical composition of Ti and TiB$_2$; the lubricating layer has a chemical composition of Ti, TiB$_2$ and MoS$_2$; and
   wherein in the lubricating layer, Ti is comprised in an amount of 10-30 at. %, B is comprised in an amount of 5-20 at. %, and the balance is MoS$_2$.

5. A self-lubricating film over wide temperature ranges in vacuum, comprising: a bonding layer, a transition layer and a lubricating layer laminated in sequence,
   wherein the bonding layer has a chemical composition of Ti; the transition layer has a chemical composition of Ti and TiB$_2$; the lubricating layer has a chemical composition of Ti, TiB$_2$ and MoS$_2$; and
   wherein a thickness ratio of the bonding layer, the transition layer and the lubricating layer is within a range of 1:(1-3):(5-10).

6. A method for preparing the self-lubricating film over wide temperature ranges in vacuum according to claim 1, comprising:
   using a Ti target to conduct a first unbalanced magnetron sputtering on a surface of a substrate to form the bonding layer on the surface of the substrate;
   using the Ti target and a TiB$_2$ target to conduct a second unbalanced magnetron sputtering on a surface of the bonding layer to form the transition layer on the surface of the bonding layer; and
   using the Ti target, the TiB$_2$ target and a MoS$_2$ target to conduct a third unbalanced magnetron sputtering on a surface of the transition layer to form the self-lubricating film over wide temperature ranges in vacuum on the surface of the substrate.

7. The method according to claim 6, wherein the first unbalanced magnetron sputtering is conducted under the following conditions: a working gas is argon, the working gas has a pressure within a range of 0.1-0.4 Pa, the Ti target has a sputtering current within a range of 2-6 A, and a negative bias voltage is within a range of 100-400 V.

8. The method according to claim 6, wherein the second unbalanced magnetron sputtering is conducted under the following conditions: a working gas is argon, the working gas has a pressure within a range of 0.1-0.4 Pa, the Ti target has a sputtering current within a range of 0.4-1 A, the TiB$_2$ target has a sputtering current within a range of 2-6 A, and a negative bias voltage is within a range of 100-400 V.

9. The method according to claim 6, wherein the third unbalanced magnetron sputtering is conducted under the following conditions: a working gas is argon, the working gas has a pressure within a range of 0.1-0.4 Pa, the Ti target has a sputtering current within a range of 0.4-1 A, the TiB$_2$ target has a sputtering current within a range of 0.4-1 A, the MoS$_2$ target has a sputtering current within a range of 1-3 A, and a negative bias voltage is within a range of 40-100 V.

10. The method according to claim 6, wherein in the lubricating layer, Ti is comprised in an amount of 10-30 at. %, B is comprised in an amount of 5-20 at. %, and the balance is MoS$_2$.

11. The method according to claim 6, wherein a thickness ratio of the bonding layer, the transition layer and the lubricating layer is within a range of 1:(1-3):(5-10).

* * * * *